United States Patent [19]
Kushner

[11] Patent Number: 5,880,689
[45] Date of Patent: *Mar. 9, 1999

[54] BALANCED DIGITAL-TO-ANALOG CONVERTER

[75] Inventor: Lawrence J. Kushner, Andover, Mass.

[73] Assignee: Massachusetts Institute of Technology, Cambridge, Mass.

[ * ] Notice: This patent issued on a continued prosecution application filed under 37 CFR 1.53(d), and is subject to the twenty year patent term provisions of 35 U.S.C. 154(a)(2).

[21] Appl. No.: 570,627

[22] Filed: Dec. 11, 1995

[51] Int. Cl.⁶ .................................................. H03M 1/66
[52] U.S. Cl. ........................................... 341/144; 341/118
[58] Field of Search ................................... 341/144, 118, 341/133, 136

[56] References Cited

U.S. PATENT DOCUMENTS

| 4,239,981 | 12/1980 | Crookshanks | 326/90 |
| 4,972,188 | 11/1990 | Clement et al. | 341/118 |
| 4,999,624 | 3/1991 | Pichlik | 341/118 |
| 5,059,977 | 10/1991 | Herman et al. | 341/144 |
| 5,266,952 | 11/1993 | Stone et al. | 341/156 |
| 5,321,401 | 6/1994 | White | 341/147 |
| 5,450,026 | 9/1995 | Morano | 326/84 |

OTHER PUBLICATIONS

Michaels, S. R., "D–a glitch—causes abound but solutions are rare," *Electronic Design*, pp. 183–187, (Apr. 1981).

Naber, J. F., et al., "A Low–Power, High–Speed 10–Bit GaAs DAC," IEEE, GaAs IC Symposium, pp. 33–36, (1990).

DAC650 Data Sheet, "12–Bit 500Mhz Digital–to–Analog Converter," pp. 1–12, Burr–Brown, (Jan. 1993).

Kushner, L.J., "An 800 MHz Monolithic GaAs HBT Serrodyne Modulator," GaAs IC Symposium, IEEE, pp. 34–37, (1994).

Parker, S.P. (Ed.), "McGraw–Hill Encyclopedia of Electronics and Computers," pp. 22–30, (1984).

MAX555 Data Sheet, "Maxim 300Msps, 12–Bit DAC with Complementary Voltage Outputs," pp. 1–12, Maxim Integrated Products, (Sep. 1994).

Weiss, F. G., et al., "A 14–Bit, 1 Gs/s DAC for Direct Digital Synthesis Applications," IEEE, GaAs IC Symposium, pp. 361–364, (1991).

Van Andrews, G., et al., "A Monolithic Digital Chirp Synthesizer Chip With I and Q Channels," IEEE, GaAs IC Symposium, pp. 19–22, (1991).

Chang, C. T. M., et al., "GaAs HBT's for High–Speed Digital Integrated Circuit Applications," *Proceedings of the IEEE*, 81 (12):1727–1743, (Dec. 1993).

Analog Devices High Speed Design Seminar, pp. IX2–IX23. AD9712/AD9713 Data Sheet, "12–Bit, 100 MSPS D/A Converters," pp. 1–8, Analog Devices.

*Primary Examiner*—Howard L. Williams
*Assistant Examiner*—Peguy JeanPierre
*Attorney, Agent, or Firm*—Hamilton, Brook, Smith & Reynolds, P.C.

[57] ABSTRACT

A balanced digital-to-analog converter has improved half-wave symmetry and glitch energy due to the use of a pair of single-ended DACs. By subtracting the outputs from a pair of DACs operating 180° out-of-phase, even-order distortion and glitch energy can be cancelled out. When the balanced DAC is employed in a high-speed direct digital synthesizer, the alias second-harmonic, which is the dominant spur, is dramatically decreased without increasing the noise level of the circuit.

70 Claims, 16 Drawing Sheets

BALANCED DIGITAL-TO-ANALOG CONVERTER

GOVERNMENT SUPPORT PARAGRAPH

The Government has rights in this invention pursuant to Contract Number F19628-95-C-0002 awarded by the United States Army.

BACKGROUND OF THE INVENTION

Spectral purity, clock speed, and direct current (dc) power consumption are three key performance parameters of a direct digital synthesizer (DDS). For a given DDS design, improvements in the underlying integrated circuit fabrication process, such as decreasing the delay-power product of the logic family, allow performance improvements without any tradeoff. Unfortunately, making major process improvements takes a considerable amount of resources. For DDSs fabricated in an existing integrated circuit process, however, spectral purity, clock speed and dc power can be traded off against each other for different applications by making architectural or circuit-level design choices. For example, higher speeds can be obtained in exchange for increased dc power by increasing the bias currents. High-speed DDSs, however, have an output spectrum that is dominated by a single large spur, the aliased second-harmonic.

The aliased second-harmonic spur in a DDS can be reduced using dithering techniques. In these techniques, an extra noise source is added to break up discrete spurious signals into broadband noise, thereby increasing the overall noise floor. Additionally, these dithering techniques are only useful for breaking up spurs caused by phase truncation, which is not a significant spur contributor in high-speed DDSs.

It has also been known that a balanced Digital-to-Analog Converter (DAC) results in reduced even-order distortion and provides common-mode rejection to noise. Indeed, a number of DACs have been developed that employ conventional differential amplifiers to maintain a pair of balanced analog signals throughout the DAC to achieve the same advantages. Although a number of differential DACs have been developed by others in the past, they are special DAC designs throughout, typically employing differential amplifiers. In many high speed DDSs, however, single ended DACs are used instead of differential DACs.

SUMMARY OF THE INVENTION

The invention relates to a circuit for reducing the even-order distortion which result from the use of single-ended DACs in waveform generators. A major contributor to the even-order distortion is the use of non-ideal transistors in the single-ended DACs. As a result, the DDS output waveform lacks half-wave symmetry. Consequently, there is a distortion in the synthesized waveform due to the even-order harmonics and their aliases. In accordance with the invention, half-wave symmetry is improved so as to result in at least a 20–30 dB reduction in the even-order distortion.

Another major contributor to the level of even-order distortion are glitches caused by logic asymmetries in the DAC. The glitches translate into high levels of spur energy when the DAC is used to create a sine wave, such as in a DDS application. In accordance with the invention, the glitch energy is negated by a circuit using single-ended DACs.

A preferred embodiment of the invention employs two DACs whose output are combined by a subtractor to create an analog output signal. A first DAC receives as an input a digital input signal and the second DAC receives a complimented digital input signal by inverting the input signal of the first DAC. The outputs of the two DACs are thus 180° out-of-phase with each other. In a particular preferred embodiment of the invention, the two DACs are employed in a waveform generator, such as a DDS.

The subtractor circuit effectively doubles the output amplitude for an ideal output signal, but substantially cancels half-wave asymmetry and DAC glitches. The subtractor can be a radio frequency transformer or a differential amplifier. Preferably, the subtractor is a differential amplifier fabricated on-chip with the two DACs.

The above and other features of the invention, including various novel details of construction and combination of parts, will now be more particularly described with reference to the accompanying drawings and pointed out in the claims. It will be understood that the particular balanced digital-to-analog converter embodying the invention is shown by way of illustration only and not as a limitation of the invention. The principles and features of this invention may be employed in varied and numerous embodiments without departing from the scope of the invention.

DETAILED DESCRIPTION OF PREFERRED EMBODIMENTS OF THE INVENTION

Figure 1:
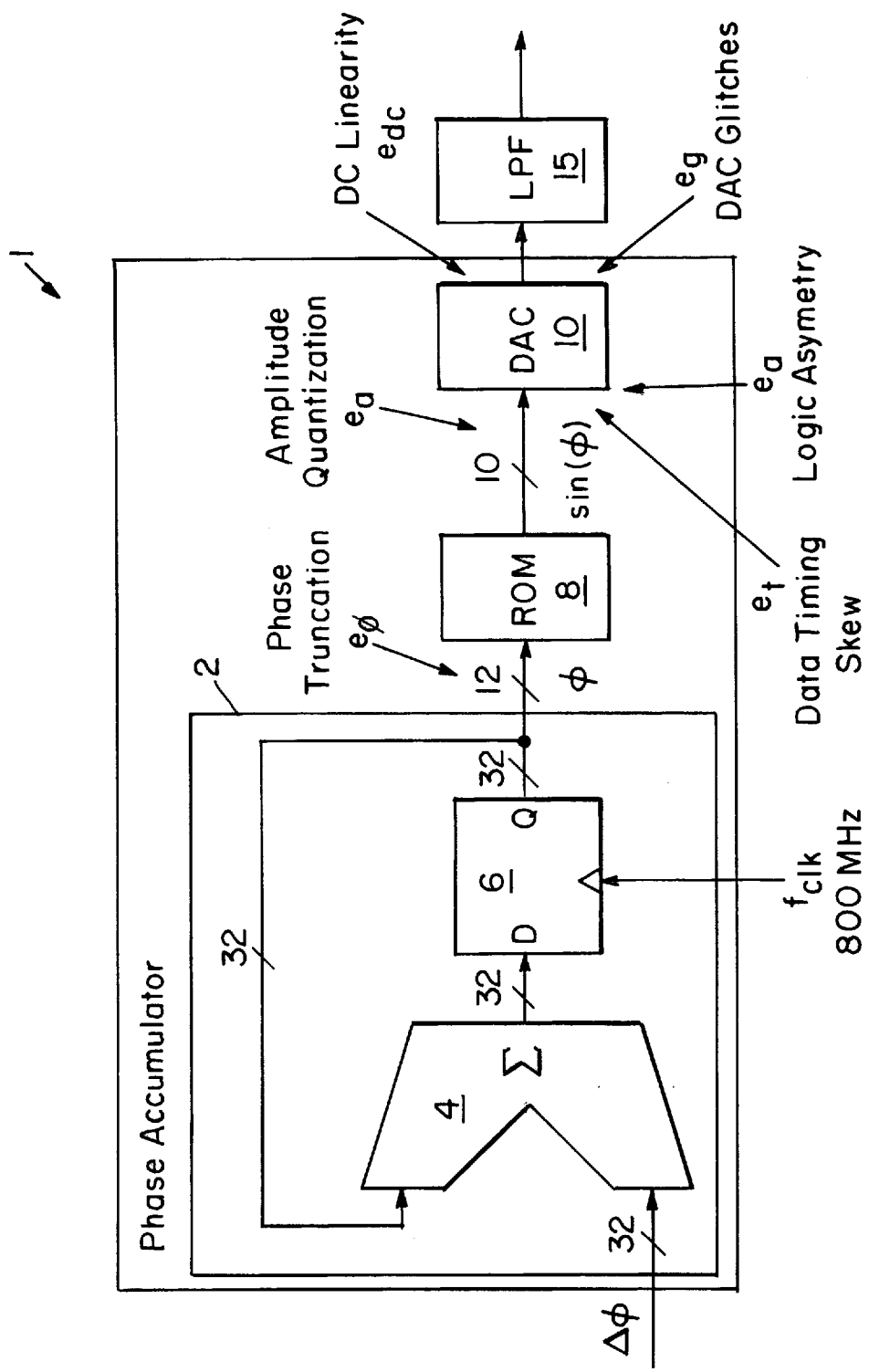
FIG. 1 is a schematic block diagram of a prior art DDS identifying various spurious signal sources.

FIG. 1 is a simplified block diagram of a DDS employing a prior art DAC. As illustrated, the DDS 1 includes a phase accumulator 2 which receives a 32-bit phase value Δφ and a clock signal of 800 MHz $f_{clk}$. The accumulator 2 includes an accumulator 4 and a shift register 6. The output of the phase accumulator 2 is a 12-bit phase value φ. A ROM 8 includes a look-up table to translate the phase value φ into a 10-bit amplitude calculated from sin(φ). A DAC 10 converts the 10-bit digital value into an analog signal which is output from the DDS 1. A low-pass filter (LPF) 15 is preferably applied to the output of the DDS to create a smoothed output signal within a selected frequency band. More detailed examples of other embodiments of DDSs which can be improved by the invention are described in U.S. Pat. No. 5,303,412, "Composite Direct Digital Synthesizer", issued on Apr. 12, 1994 to Larry Kushner and U.S. patent application Ser. No. 08/211,652, "Composite Direct Digital Synthesizer", filed on Apr. 11, 1994 by Larry Kushner, the teachings of which are both incorporated herein by reference in their entirety.

The prior art DDS 1 is known to include various spurious signal sources. For example, the phase accumulator 2 creates phase truncation errors $e_φ$ due to the removal of the least significant bits from the phase value φ. In addition, the ROM 8 creates amplitude quantization errors $e_q$ when converting the 12-bit phase value φ into a 10-bit amplitude value.

Figure 2:
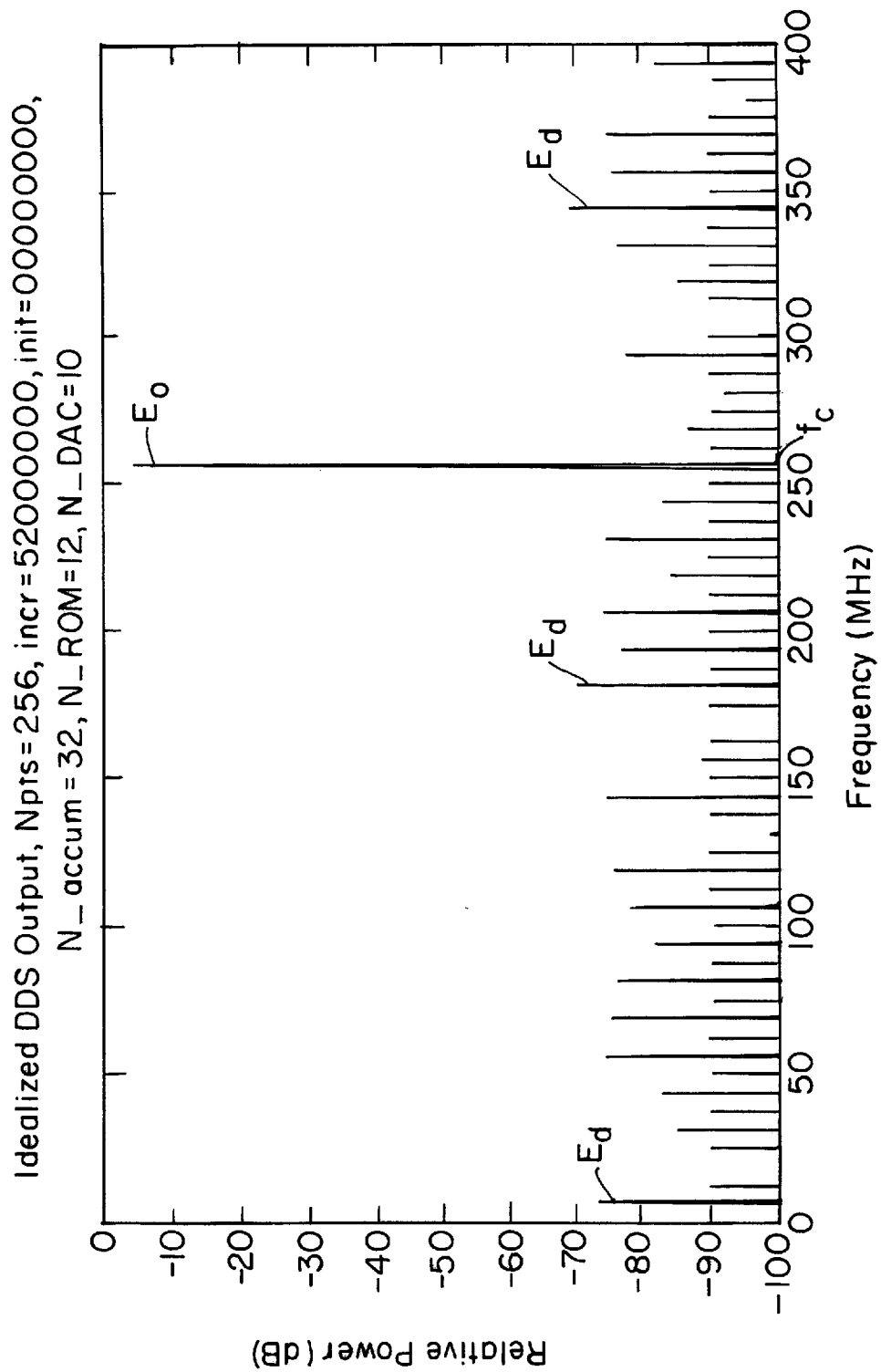
FIG. 2 is a graphical representation of the output spectrum of the prior art DDS of FIG. 1 having an ideal DAC.

FIG. 2 is a graphical representation of the output spectrum of the DDS of FIG. 1 using an ideal DAC. The output frequency $f_o$ is shown as an energy spike $E_o$ at about 256 MHz. There are also distortion spurs $E_d$ due to phase truncation $e_φ$ from the phase accumulator 2 and amplitude quantization $e_q$ from the ROM 8, which are both better than −70 dBc.

The DAC 10, however, also creates errors. In practice, the output spectrum of a high-speed DDS is often dominated by a single large spur, such as the second-harmonic or the aliased second-harmonic. For example, at an 800 MHz clock speed, the worst case spurs are approximately −30 dBc. These errors are due to the use of an imperfect DAC 10.

Returning to FIG. 1, the DAC 10 at the DDS output introduces spurs in a number of ways. The spurs can result from dc linearity errors $e_{dc}$ from the DAC 10, input-data timing skew $e_t$ (i.e., unequal arrival times) to the DAC 10, and logic asymmetries $e_a$ (0-to-1 transition not equal to 1-to-0 transition) in the DAC 10. The timing skew $e_t$ and logic asymmetries $e_a$ result in glitches $e_g$ at the output of the DAC 10, and they can also result in a shift in the waveform zero-crossing. A DDS architecture in accordance with the invention reduces spurs caused by dc linearity errors $e_{dc}$ and DAC glitches $e_g$.

Figure 3A:
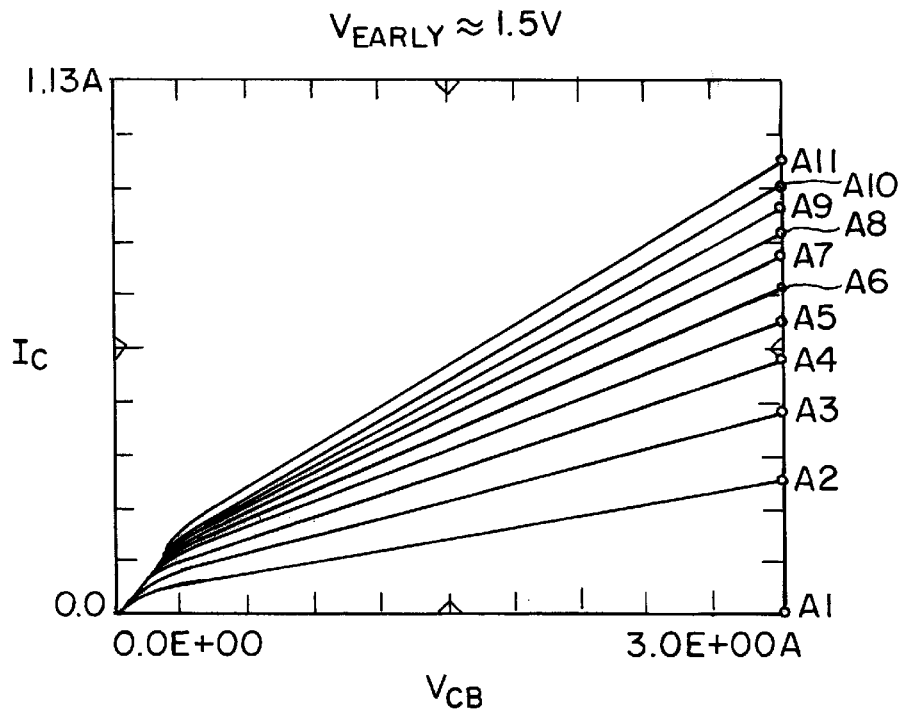
FIGS. 3A–3B are graphical representations of output characteristics for a transistor having an Early voltage of 1.5 volts and 20 volts, respectively.
Figure 3B:
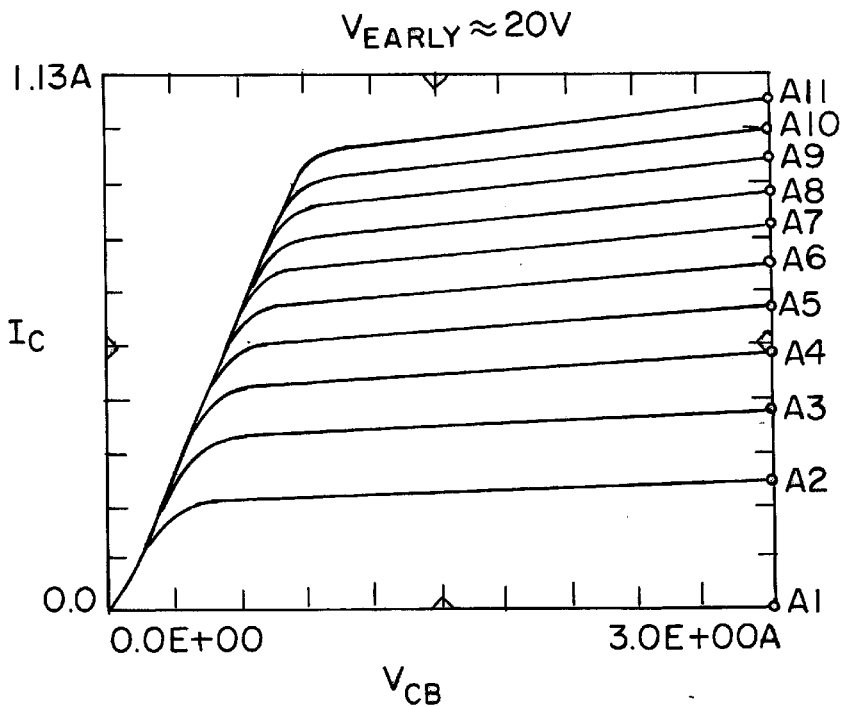

FIGS. 3A–3B are graphical representations of output characteristics for a transistor having an Early voltage of 1.5 volts and 20 volts, respectively. The Early voltage $V_{Early}$ is a measure of the slope of a transistor's collector current ($I_c$) vs. collector voltage ($V_{CB}$) curve in the active region. An ideal transistor has an infinite Early voltage (i.e., $V_{Early}=\infty$). As the Early voltage $V_{Early}$ of the transistor increases, the transistor's collector current-voltage curves become more ideal (i.e. flat in the active region).

Figure 4:
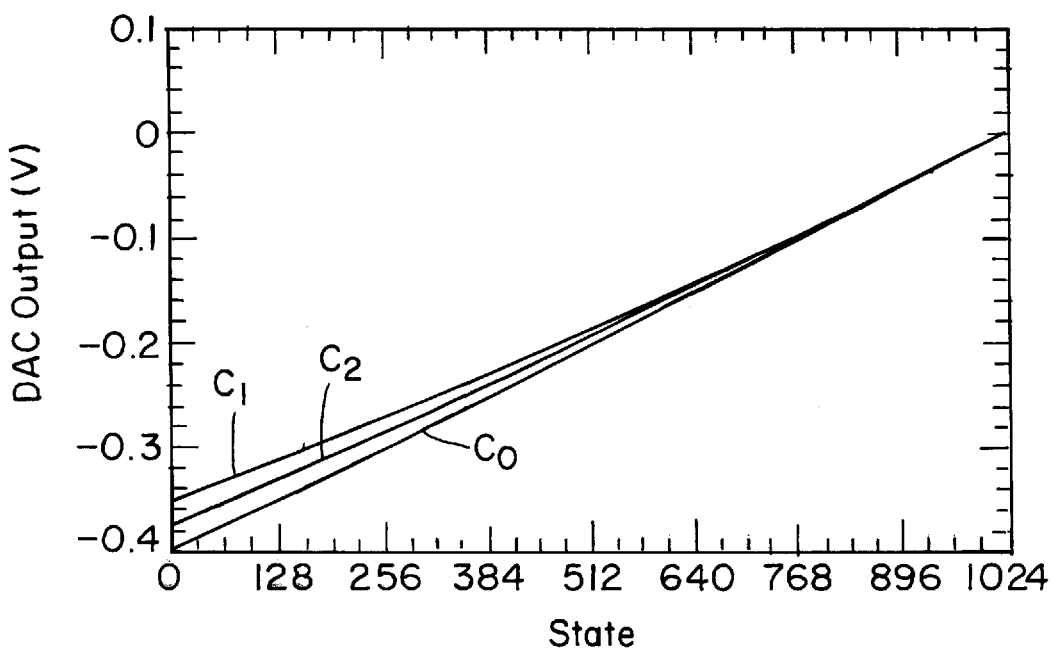
FIG. 4 is a graphical representation of DAC output based on the Early voltage.

FIG. 4 is a graphical representation of DAC output as related to the Early voltage. Shown are three curves: a curve $C_0$ for a prior art DAC 10 having ideal transistors; a curve $C_1$ for a prior art DAC 10 having transistors with Early voltages of 1.5 volts; and a curve $C_2$ for a prior art DAC 10 having transistors with Early voltages of 20 volts. As can be seen, as the Early voltage increases the DAC output becomes closer to the ideal curve $C_0$. Consequently, prior art DACs 10 are best fabricated with transistors having high Early voltages. Transistors having Early voltages at least as high as 100 volts have been fabricated.

Figure 5:
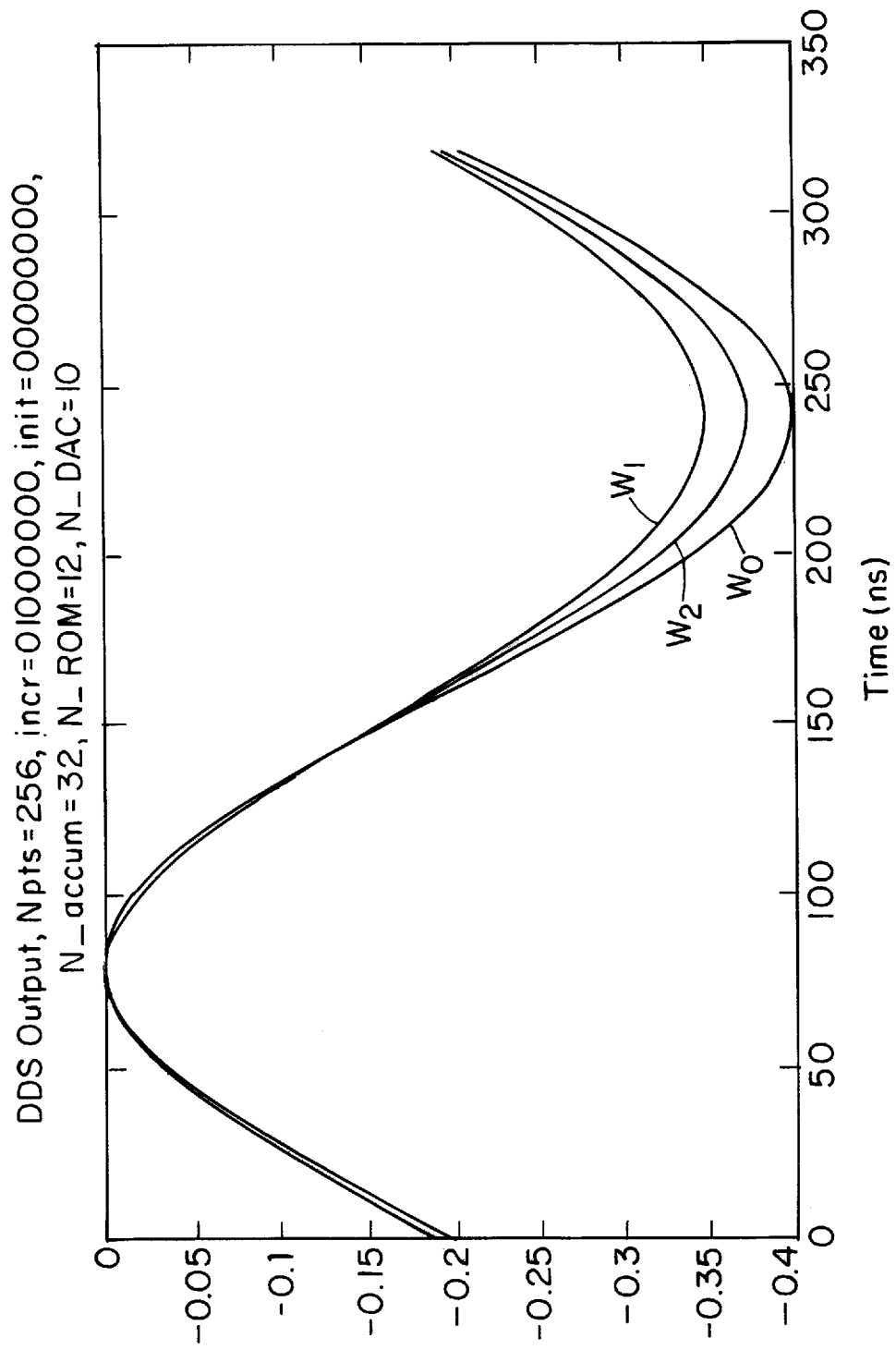
FIG. 5 is a graphical representation of the output waveform from the DDS of FIG. 1.

FIG. 5 is a graphical representation of the output waveform from the DDS of FIG. 1 having a prior art DAC. Because the DDS is a sampled-data system, the output spectrum is periodic with the clock period $f_{clk}$. Shown are time-domain waveforms which are ideally a sine wave $W_0$. However, dc linearity errors result in the lower half of the waveform becoming distorted as the DAC output deviates away from the ideal. This introduces a half-wave asymmetry, which from Fourier theory results in even-order harmonics. Shown are the time-domain waveforms $W_1$, $W_2$ for a synthesized sine wave where the DAC transistors have $V_{Early}=1.5$ volts and $V_{Early}=20$ volts, respectively; both of which illustrate the asymmetry.

Figure 6A:
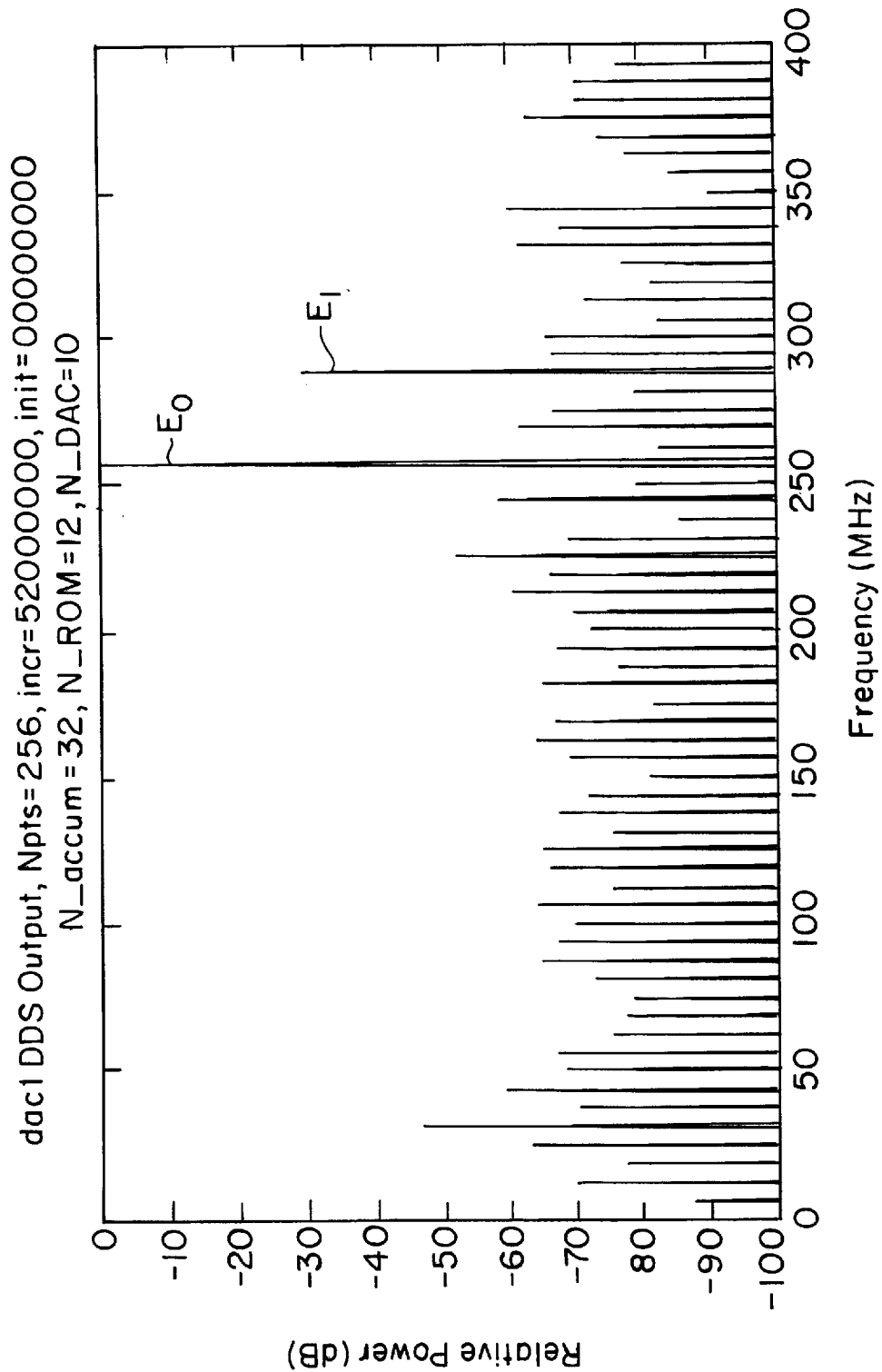
FIGS. 6A–6B are graphical representations of the output spectrum of the DDS of FIG. 1 with transistors having an Early voltage of 1.5 volts and 20 volts. respectively.
Figure 6B:
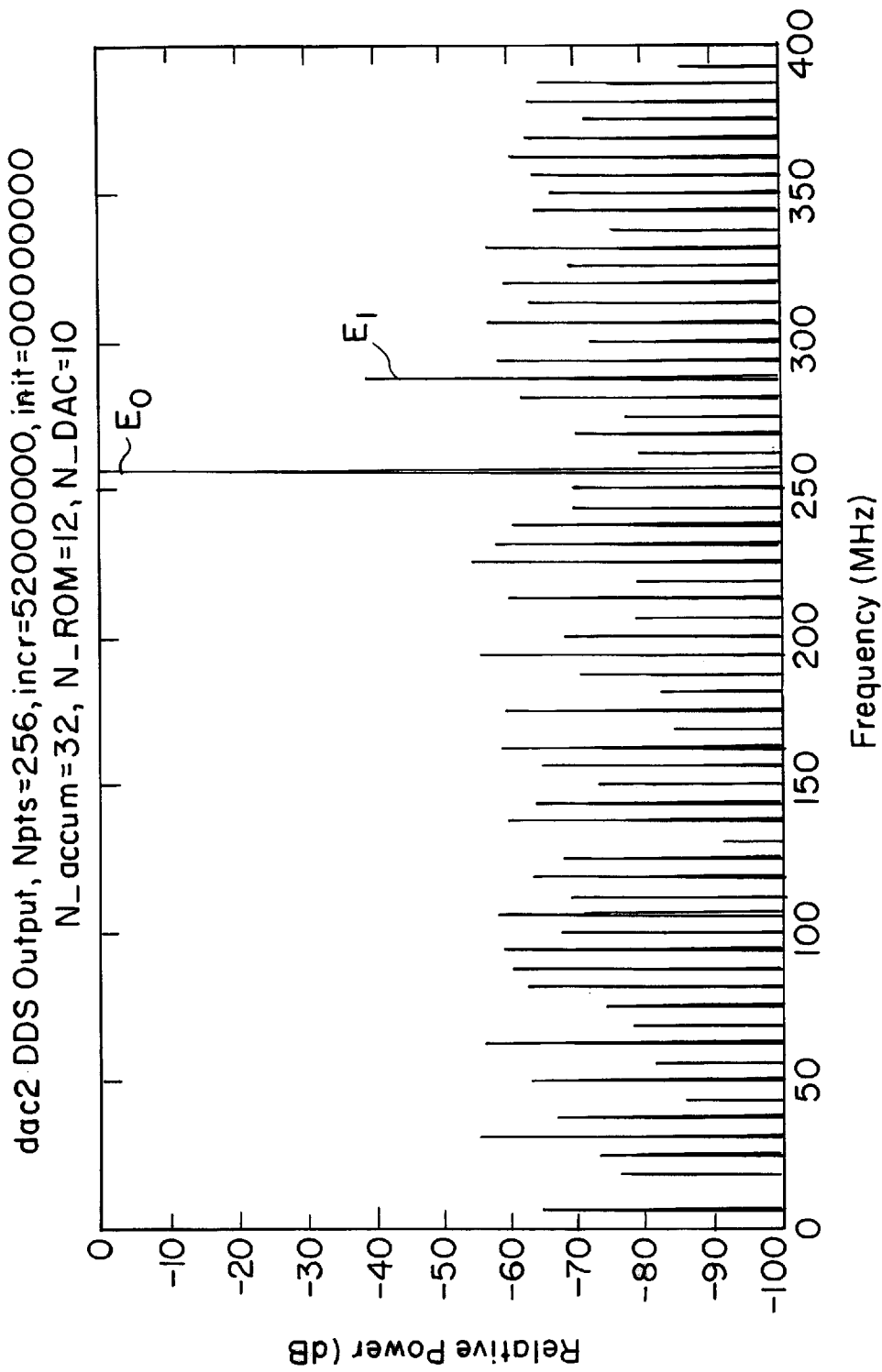

FIG. 6A–6B are graphical representations of the output spectrum of the DDS of FIG. 1 with transistors having Early voltages of 1.5 volts and 20 volts, respectively. The alias second-harmonic $E_1$, $E_2$ at about 288 MHz is the dominant spur. That is because once the DDS is tuned to have an output frequency above $f_{clk}/4$, the second-harmonic of the first-replica spectrum, centered around $f_{clk}$, becomes aliased back down in band.

The aliased second-harmonic spurs $E_1$, $E_2$ can be reduced by improving the half-wave symmetry, which also reduces the second-harmonic itself along with other even-order distortions. This can be accomplished by employing a balanced DAC. Although many DACs are inherently differential (or balanced), most high-speed DACs are fabricated as single-ended devices. For example, the digital-HBT fabrication process used by Texas Instruments Incorporated is inherently single-ended, with all emitters of all transistors grounded. Preferred embodiment of the invention achieves a balanced effect with a pair of single-ended DACs.

In a preferred embodiment, the high-speed DAC 10 is fabricated as an integrated circuit in a high-speed semiconductor material, such as GaAs. The use of GaAs fabrication allows the DAC 10 to operate at high frequencies. One well-suited fabrication process is Heterojunction Integrated Injection Logic ($HI^2L$), as developed by Texas Instruments Incorporated. In the $HI^2L$ configuration, transistors are configured as common-emitter-down Heterojunction Bipolar Transistors (HBT).

Figure 7:
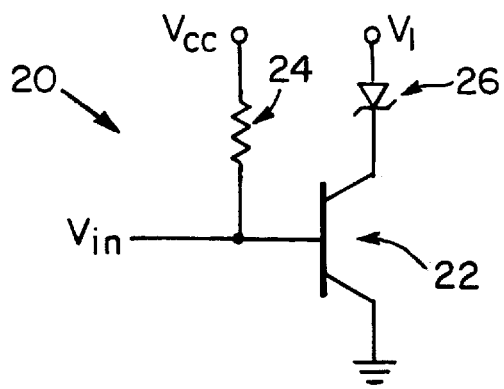
FIG. 7 is a schematic diagram of an example circuit employing a common-emitter-down Heterojunction Bipolar Transistor (HBT).

FIG. 7 is a schematic diagram of an example circuit 20 employing a common-emitter-down HBT. As illustrated, the circuit 20 includes a transistor 22, a resistor 24 and a diode 26. The emitter of the transistor 22 is grounded. FIGS. 8A–8E are schematic diagrams of a process of fabricating the circuit 20 of FIG. 7 in accordance with the invention.

Figure 8A:
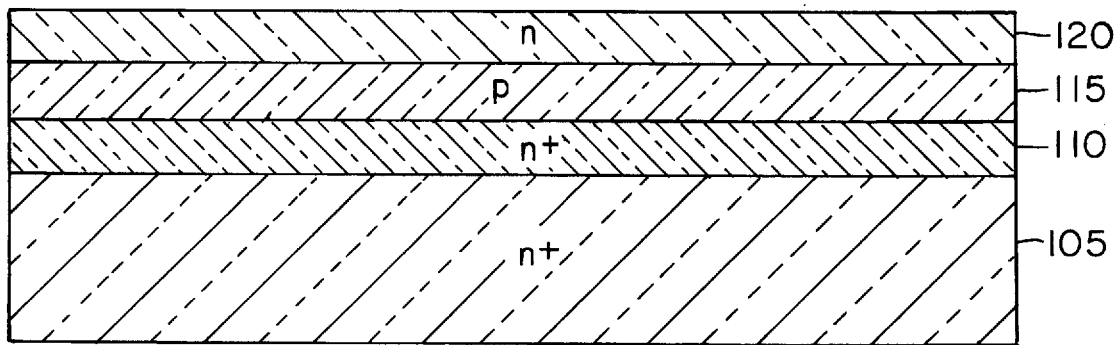
FIGS. 8A–8E are schematic diagrams of a process for fabricating the circuit of FIG. 7 in accordance with the invention.

A conductive substrate 105 and epitaxial layers 110, 115, 120 are shown in FIG. 8A. These starting materials are Metalorganic Chemical Vapor Deposition (MOCVD) grown on a $n^+$ GaAs substrate 105. The first epitaxial layer 110 is grown on the substrate 105 using $n^+$ AlGaAs. This layer forms the transistor emitter. The second epitaxial layer 115 is grown using $n^-$ GaAs implanted with a p-type dopant such as beryllium. This layer forms the transistor base. The third epitaxial layer 120 is grown using n GaAs. This layer forms the transistor collector.

Figure 8B:
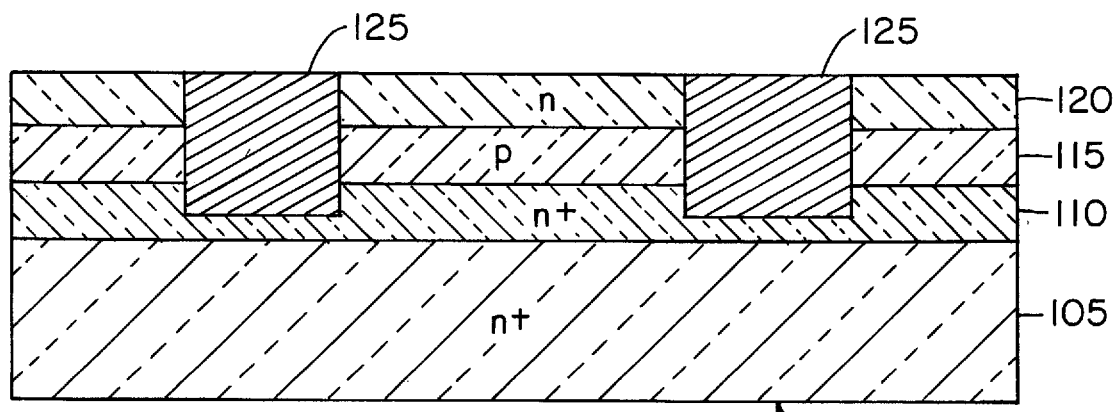
Figure 8C:
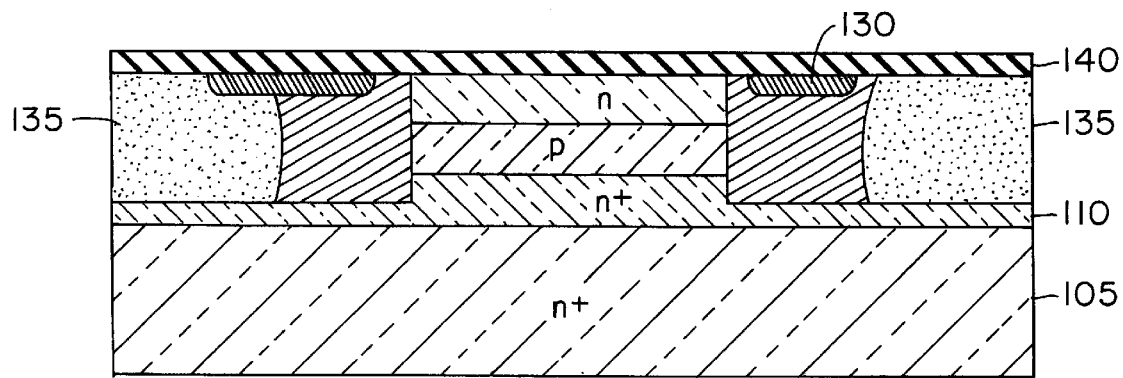

To provide $p^+$ base contacts, a p-type dopant such as beryllium is implanted. The implantation regions 125 are shown in FIG. 8B. FIG. 8C shows the formation of a high surface zinc concentration 130 to improve the yield of p-ohmic base contacts. GaAs isolation regions 135 are then created by using a high-energy boron implant. Both the implantation regions 125 and the isolation regions 135 extend into but not through the first epitaxial layer 110, to provide for the common-emitter. A protective layer 140 of $Si_3N_4$ is then deposited over the surface.

Figure 8D:
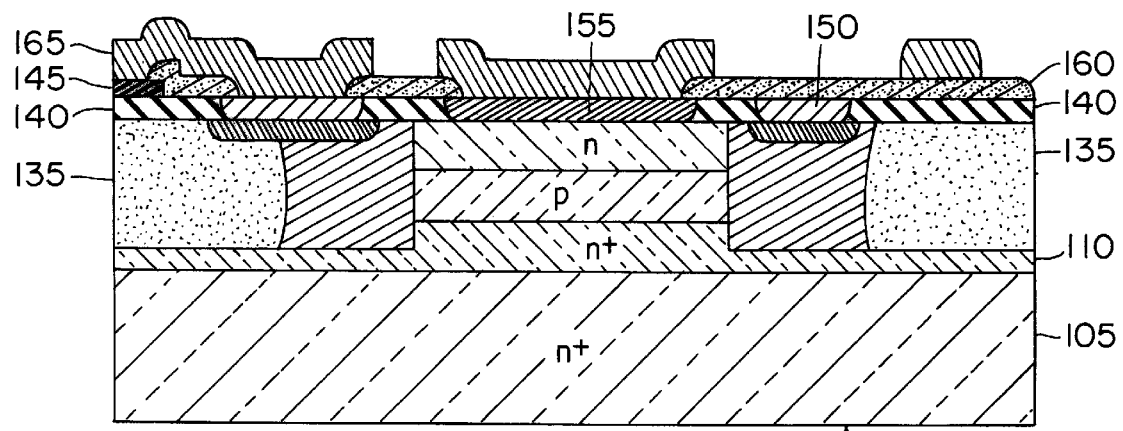

Turning to FIG. 8D, a cermet (CrSiO) thin-filmed resister 145 is then RF sputtered and ion milled onto the protective layer 140. The protective layer 140 is then selectively etched away to access the zinc surface 130 and collector region 120. A p-ohmic metal such as AuZn is deposited to create the base contacts 150. A Schottky diode contact 155 connected to the collector is provided by depositing TiPtAu as shown. The interconnect system is then formed with two dielectric-interconnect levels. Both interconnect levels use a $SiO_2$ dielectric and TiWAu interconnects. The first dielectric level 160 is deposited and etched. Optionally, either or both base contacts 150 could be accessed. The first interconnect level 165 is then deposited and etched.

Figure 8E:
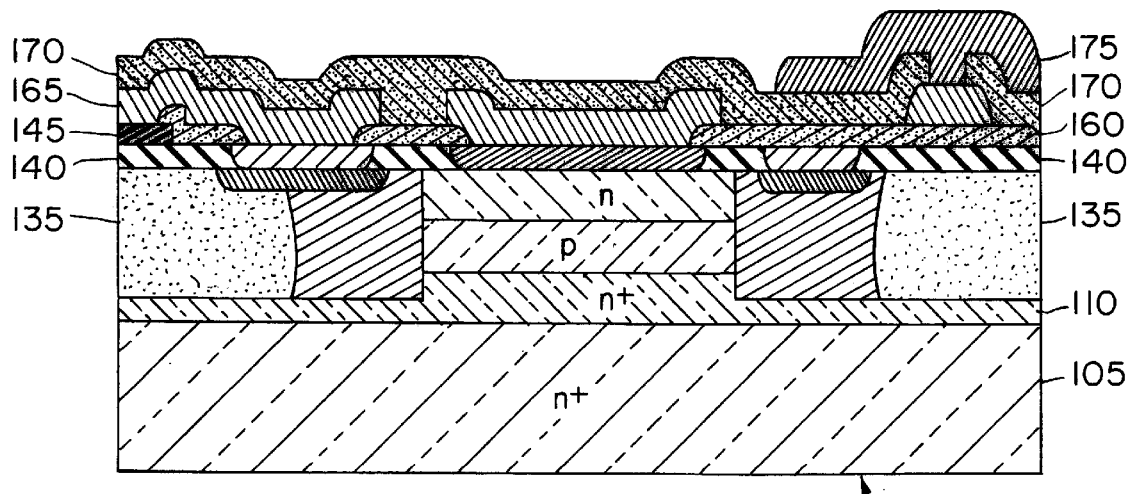

The second dielectric level 170 is deposited and etched as shown in FIG. 8E. Finally, the second interconnect level is deposited and etched.

A number of other techniques known to those skilled in the art can also be employed without deviating from the scope of the invention. For example, instead of an implanted-base process, a grown-base or Molecular Beam Epitaxy (MBE) base process can be used to fabricate the circuitry described herein.

By using the above-described technology, the invention realizes several advantages. Because all emitters 110 are common and connected to the conduction substrate 105, the only bus required is a power bus for $V_{in}$. The n+ substrate 105 also provides a solid ground. In addition, the Schottky collectors 155 provide for a large fanout for the transistor. Finally, power dissipation can be reduced by changing the value of the cermet resistor 145, which controls gate power. Because the emitters 110 are all grounded, however, traditional differential amplifiers and differential DACs cannot be directly fabricated.

Figure 9:
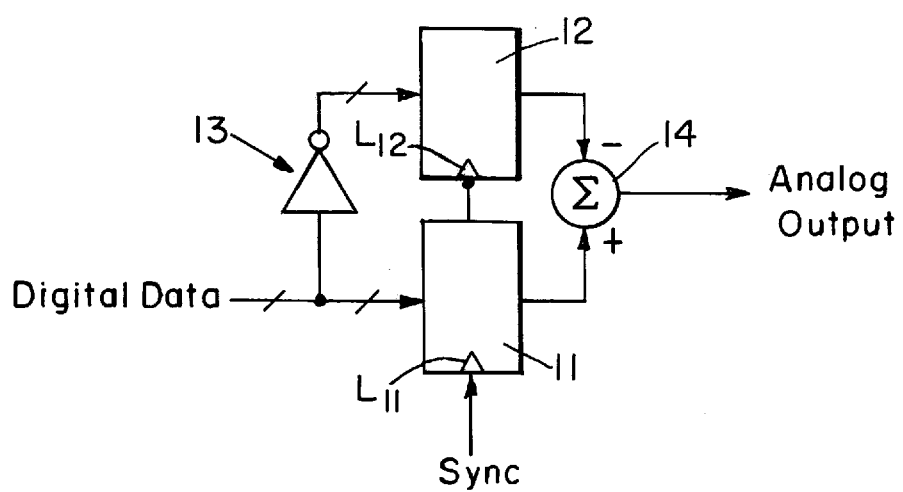
FIG. 9 is a schematic diagram of a balanced DAC in accordance with the invention.

FIG. 9 is a simplified block diagram of a balanced DAC in accordance with the invention. As illustrated, there are two single-ended DACs 11, 12. A first DAC 11 receives the digital data from the ROM 8. A second DAC 12 receives a ones-compliment of the digital data from the ROM 8 which is inverted by an inverter circuit 13. The pair of single-ended DACs are thus operated 180° out-of-phase. That is, when one DAC is at its maximum value, the other DAC is at its minimum value.

As illustrated, each DAC 11,12 includes a respective latch or flip-flop $L_{11}$, $L_{12}$. The latches $L_{11}$, $L_{12}$ come after the inverter 13 and are driven by a synchronization signal SYNC, such as the clock frequency $f_{clk}$. The latches $L_{11}$, $L_{12}$ thus insure that the timings of the DAC output signals are synchronized so as to time-align any DAC glitches.

A subtractor circuit 14 receives the outputs of the two DACs 11, 12, which doubles the output amplitude and improves the half-wave symmetry. The level of even-order distortion is thereby reduced. In other words, while the fundamentals of the two DACs 11, 12 are 180° apart, the second-harmonics are 360° apart and get cancelled by the output subtractor circuit 14. In a preferred embodiment of the invention, the DACs 11, 12 and the inverter circuit 13 are fabricated on a common substrate.

Figure 10:
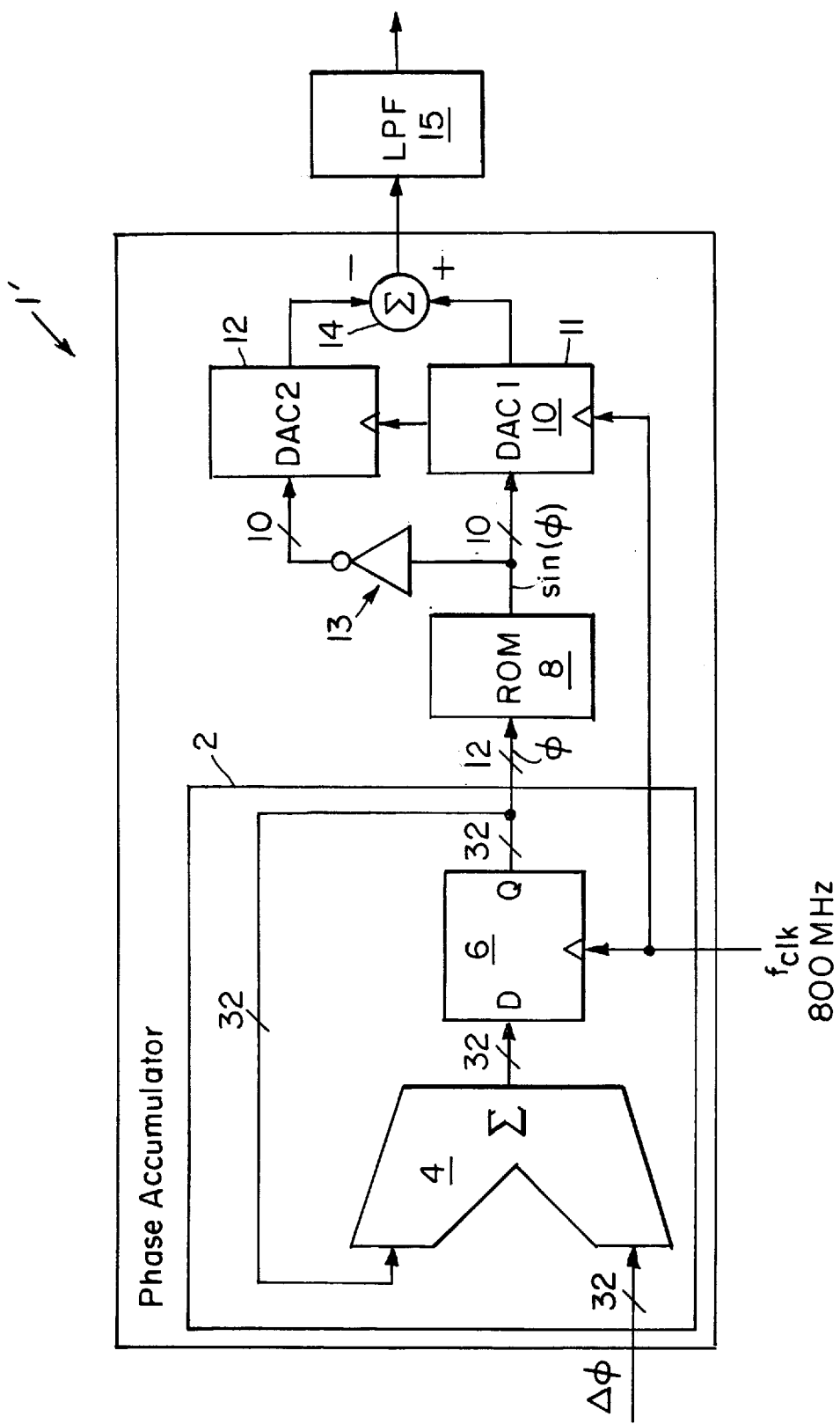
FIG. 10 is a schematic diagram of a DDS with the balanced DAC of FIG. 9.

FIG. 10 is a simplified block diagram of a preferred embodiment of a DDS having the balanced DAC of FIG. 9.

The balanced DDS 1 is structurally similar to the prior art DDS 1 of FIG. 1, except that the original DAC 10 is replaced by a pair of single-ended DACs 11,12, an inverter 13, and a subtractor 14, the operation of which is described above with reference to FIG. 9.

Figure 11:
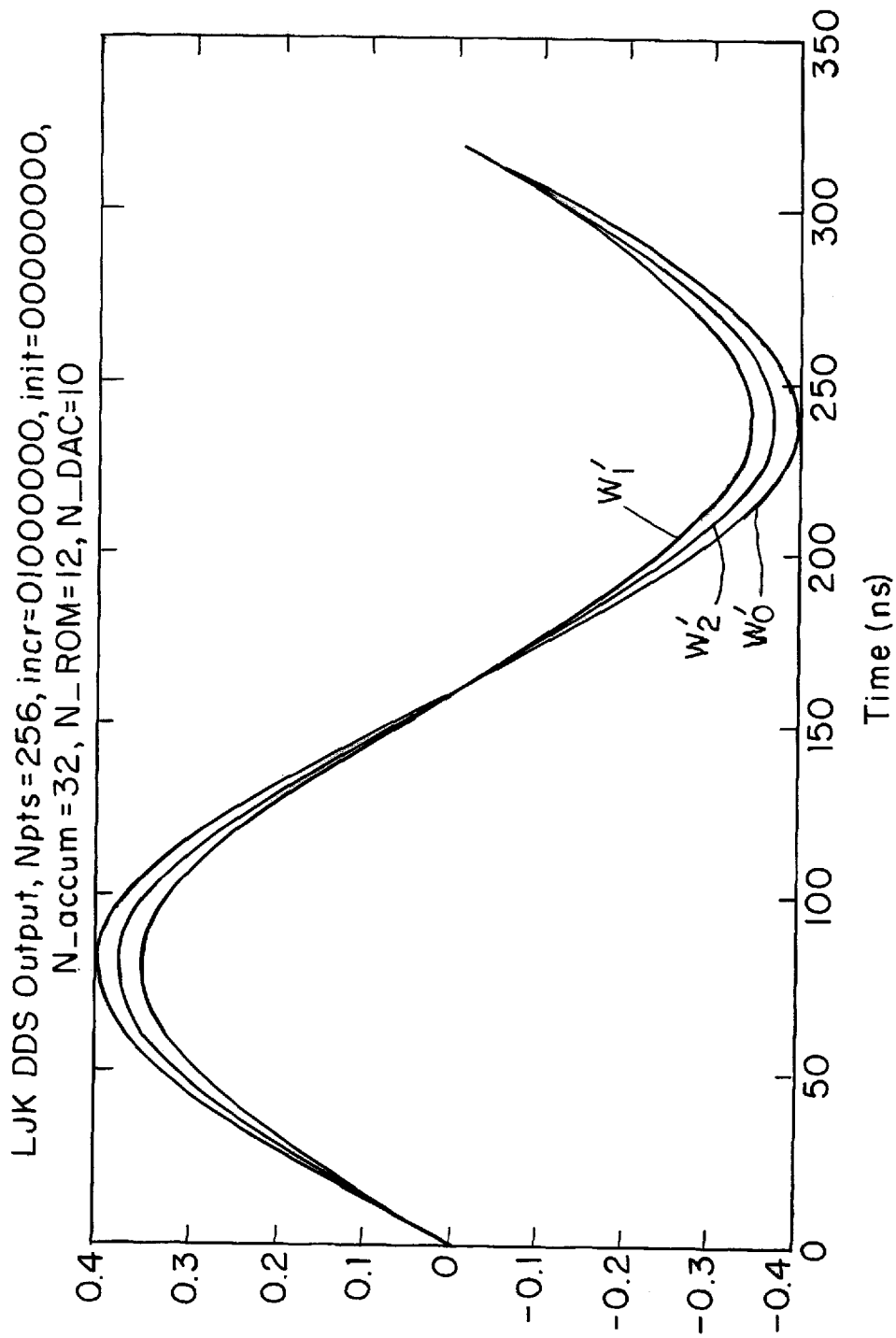
FIG. 11 is a graphical representation of the output waveform from the DDS of FIG. 10.

FIG. 11 is a graphical representation of an output waveform from the DDS of FIG. 10. Shown are the time-domain waveforms for an ideal sine wave $W_0'$, and sine waves $W_1'$, $W_2'$ generated by a preferred DAC 11,12 having transistors with $V_{Early}=1.5$ volts and $V_{Early}=20$ volts, respectively. As illustrated, both the bottom half and the top half of the sine waves $W_1'$, $W_2'$, $W_0'$ are symmetrical. This is true regardless of the Early voltage or the frequency of the waveform.

Figure 12A:
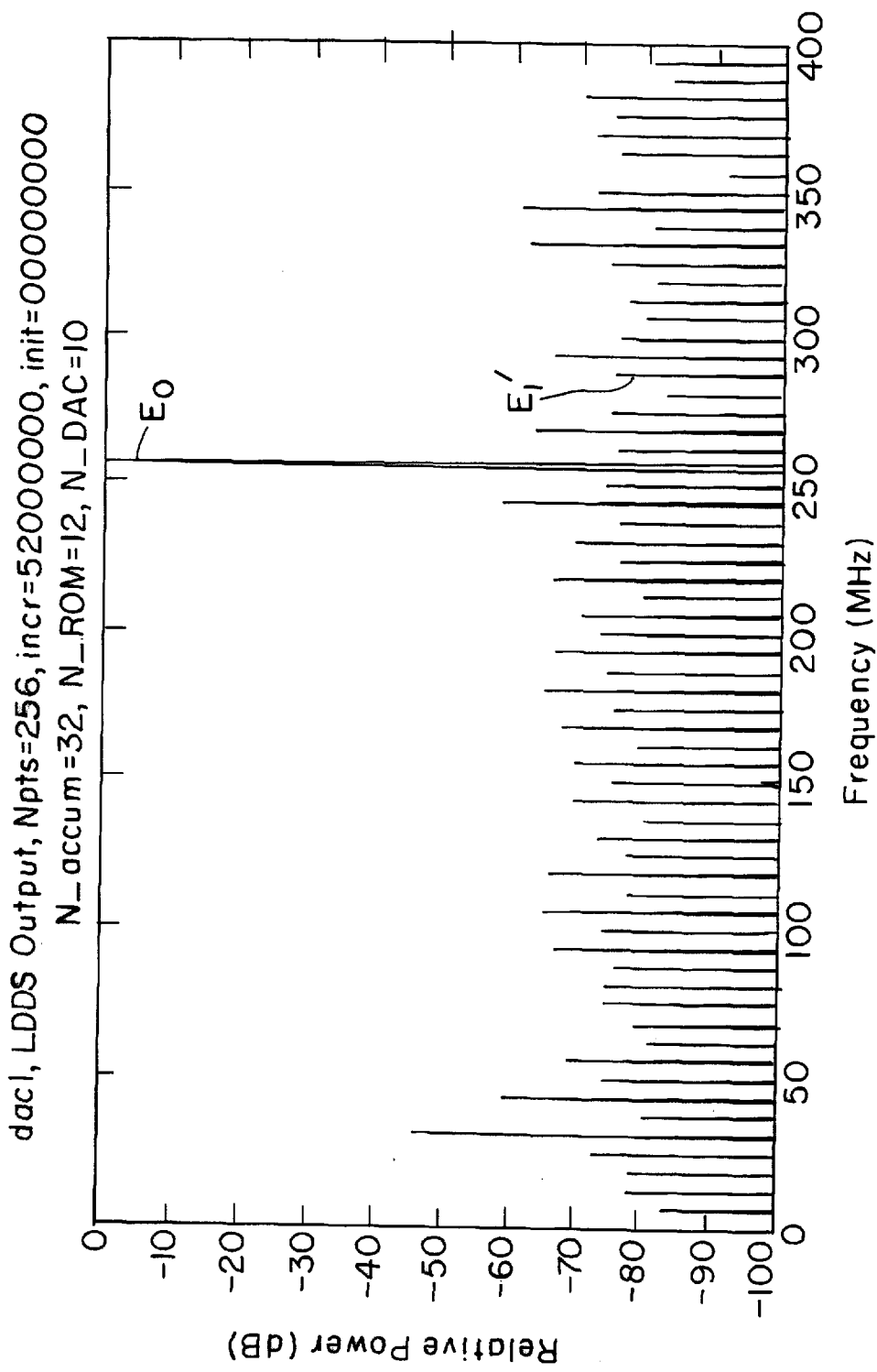
FIGS. 12A–12B are graphical representations of the simulated output spectrum of the DDS of FIG. 8 with transistors having an Early voltage of 1.5 volts and 20 volts, respectively.
Figure 12B:
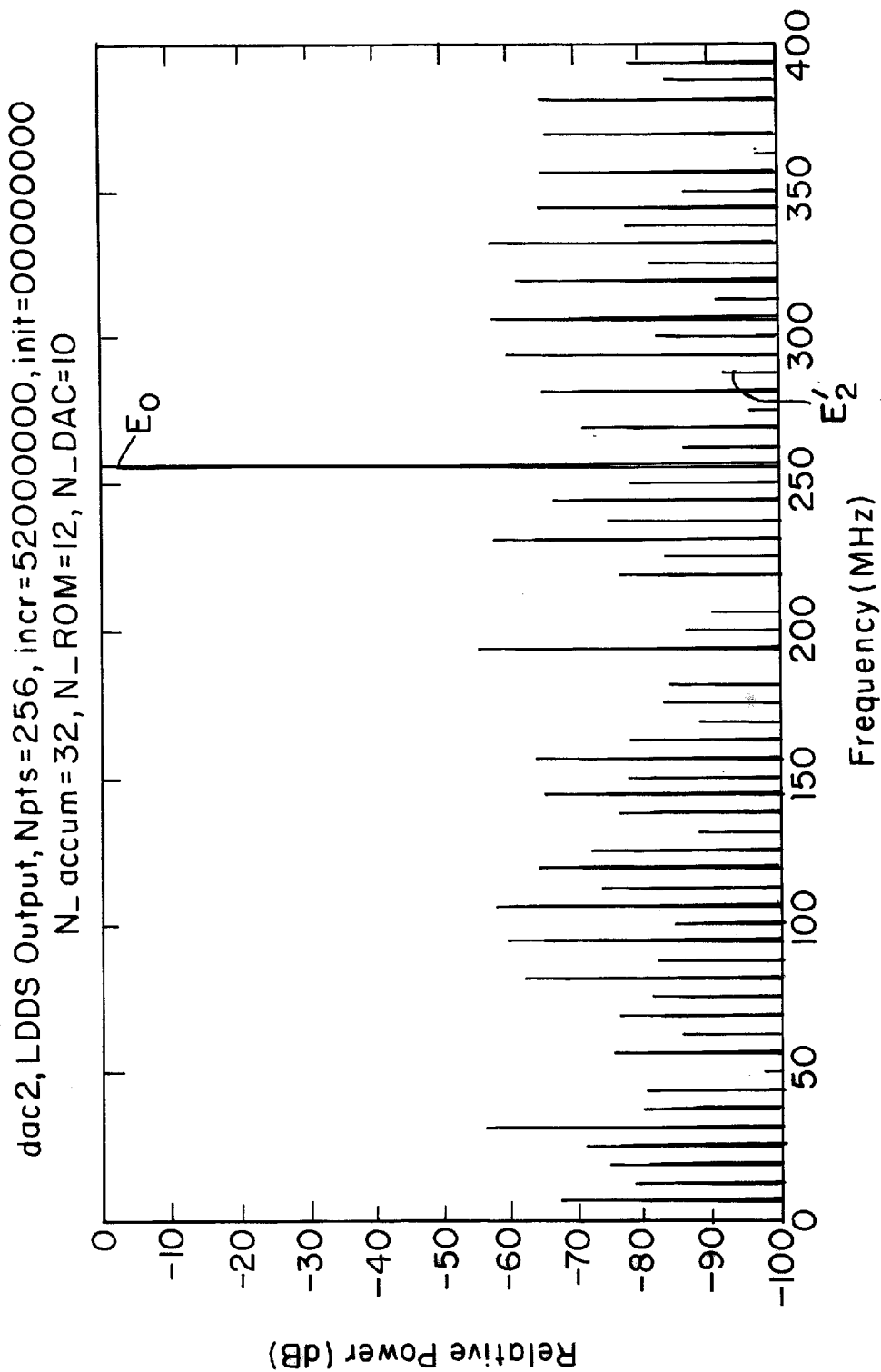

FIGS. 12A–12B are graphical representations of the simulated output spectrum of the DDS of FIG. 10 with transistors having an Early voltage of 1.5 volts and 20 volts, respectively. The illustrated simulation is independent of clock frequency and thus does not model DAC glitches. As shown, the alias second-harmonic creates a spur $E_1'$ of less than about –75 dBc where the Early voltage is 1.5 volts. When the Early voltage is 20 volts, the alias second-harmonic spur $E_2'$ is below –92 dBc. The spurs $E_1'$, $E_2'$ due to the alias second-harmonic are reduced because the balanced DAC improves the spurs caused by dc non-linearities $e_{dc}$, which are a dominant source of spurs at high frequencies, such as 800 MHz. These improved spur levels are obtained with a modest 10–20% increase in dc power due to the addition of a second DAC.

Glitches caused by logic asymmetries $e_a$ result from unequal transitions between binary 0s and 1s. For example, if the two DACs 11,12 are crossing their mid-scale values, then one DAC 11 will have an input transition from say 0111111111 to 1000000000 while the other DAC 12 will transition from 1000000000 to 0111111111. However, assuming that the 0-to-1 transition is faster than the 1-to-0 transition, both DAC inputs will momentarily go to all 1s (1111111111) before assuming their final values, causing the classic mid-range glitch in each DAC.

Figure 13:
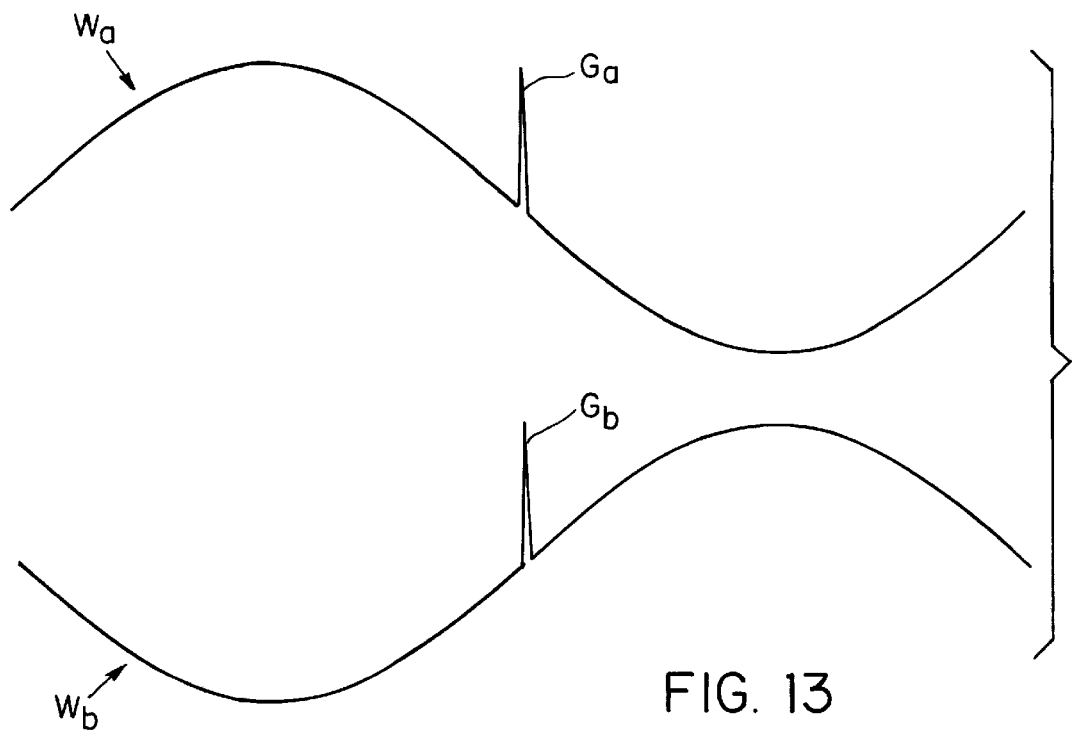
FIG. 13 is a simplified diagram of waveforms having mid-range glitches.

FIG. 13 is a simplified diagram of waveforms having mid-range glitches. Illustrated are two waveforms $W_a$, $W_b$, each from a respective DAC 11,12 and having mid-range glitch energy $G_a$, $G_b$ of approximately the same magnitude occurring at the same time. Because both of these DAC glitches $G_a$, $G_b$ are in the same direction (i.e., up or positive), the output subtractor 14 can effectively cancel these glitches when subtracting the DAC waveforms $W_a$, $W_b$.

Glitch energy can also be reduced by a DAC feedback loop, such as described in U.S. Pat. No. 5,321,401, "Method and Apparatus for Digital to Analog Conversion with Minimized Distortion", issued on Jun. 14, 1994 to William A. White. Due to parasitic capacitances in the switching transistors, even if the feedback loop can minimize the glitch impulse, that does not necessarily remove the glitch entirely. All the feedback loop does is make the negative and positive glitch areas equal, which leaves a glitch doublet.

Figure 14:
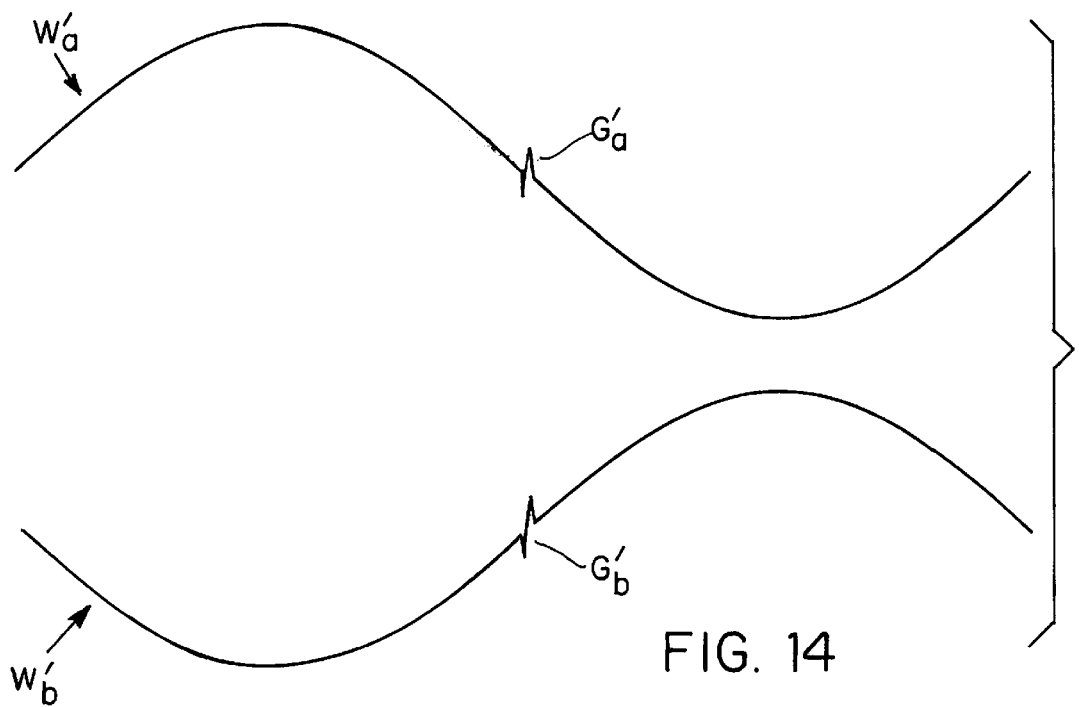
FIG. 14 is a simplified diagram of sine waves having a glitch doublet.

FIG. 14 is a simplified diagram of sine waves having a glitch doublet. Illustrated are two waveforms $W_a'$, $W_b'$, each from a respective DAC 11,12 and having a glitch doublet $G_a'$, $G_b'$. Because all of the glitch doublets $G_a'$, $G_b'$ should be in the same direction, the output subtractor 14 can also be effective in suppressing the glitch doublets $G_a'$, $G_b'$.

Figure 15:
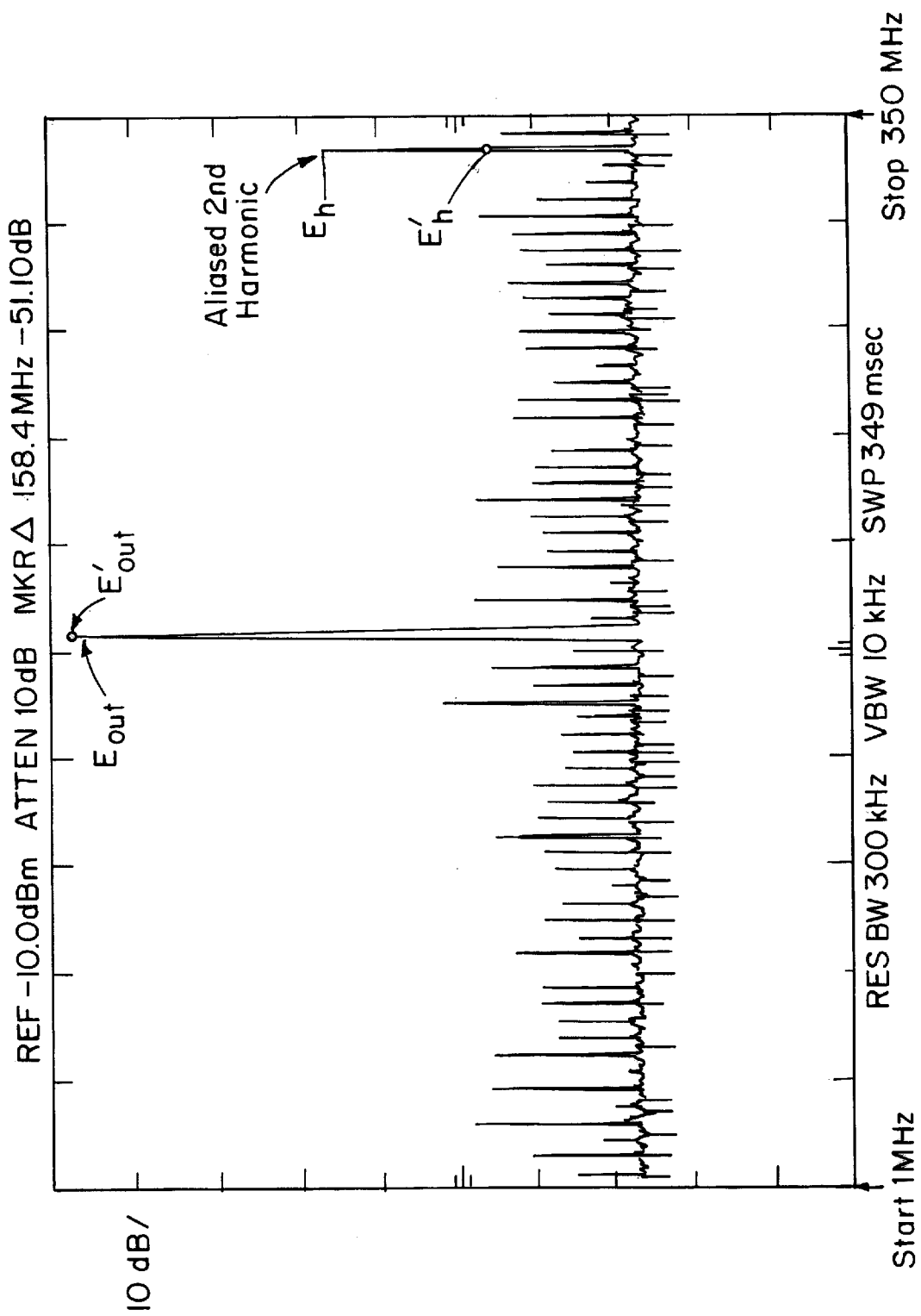
FIG. 15 is a graphical representation comparing the measured output spectrum of a conventional DDS and a DDS embodying the invention.

FIG. 15 is a graphical representation comparing the measured output spectrum of a conventional DDS and a DDS embodying the invention. Illustrated is the output energy $E_{out}$, $E_{out}'$ for a prior art DDS and a DDS in accordance with the invention, respectively. Also illustrated are the respective aliased second-harmonic spurs $E_h$, $E_h'$.

In this embodiment of the invention, two prior art 32-bit DDS chips are used, having transistors with a 1.5 volt Early voltage. Their outputs are subtracted with a simple center-tapped RF transformer. Because it is impossible to add a second DAC within the DDS chips, the same effect is created by programming a 180° phase shift into the phase-modulation port of one of the prior art DDSs. The two accumulators are synchronized via their RESET and FREQUENCY_LOAD signals. Line stretchers are placed on the clock lines to synchronize the two parts, essential for glitch cancellation.

As shown, at a clock frequency of 700 MHz, a 22 dB improvement in alias second-harmonic spur energy is observed at DDS output frequencies near $f_{clk}/3$. It is worth noting that the two DDSs can be from different wafers and can be mounted on separate circuit boards. The clock line lengths and DAC dc bias adjustments can be made once and then left alone as the DDS is tuned to different output frequencies.

Better cancellation can be observed if the two DACs are located adjacent to each other on the same chip, because the matching would then be considerably better. To achieve improved matching (and thus spur cancellation), the two DACs can be laid out on one chip in an interleaved fashion rather than side-by-side. For even better performance, a common-centroid layout technique can be employed to reduce the effects of process or thermal gradients to a minimum.

Figure 16:
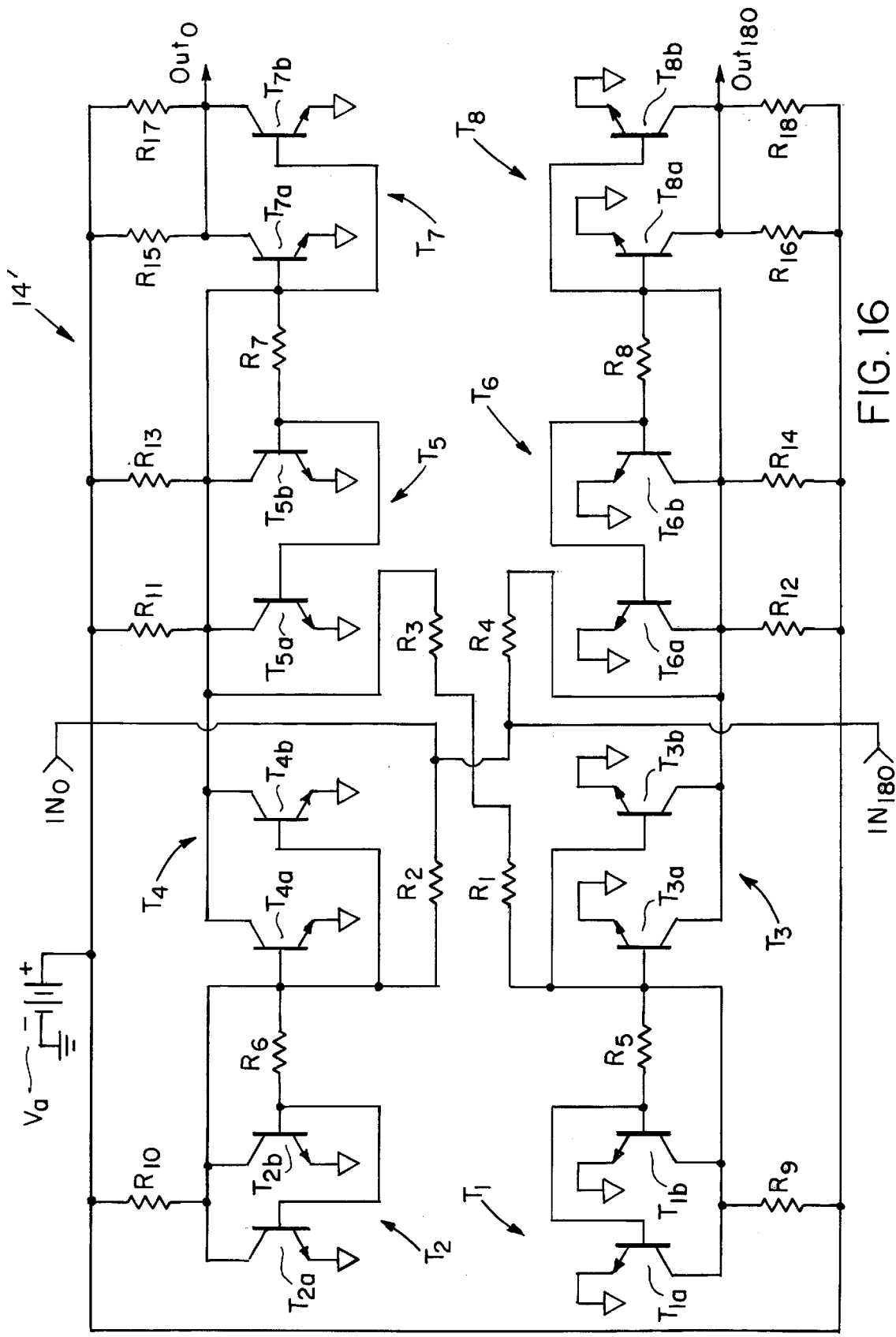
FIG. 16 is a schematic diagram of a preferred embodiment of a subtractor circuit.

FIG. 16 is a schematic diagram of a preferred embodiment of a subtractor circuit 14' in accordance with the invention. The subtractor circuit 14' is powered by a dc voltage $V_a$. A pair of complimentary waveforms are input signals $IN_0$ and $IN_{180}$. The input signal $IN_{180}$ is therefore 180° out-of-phase with the input signal $IN_0$. As illustrated, there are input resistors $R_1$, $R_2$, $R_3$, $R_4$ which are chosen to be 6,000 ohms. Also illustrated are transistors $T_1$, $T_2$, $T_3$, $T_4$, $T_5$, $T_6$, $T_7$, $T_8$ which are split into a-b pairs and laid out in a common-centroid fashion. Such an arrangement reduces the circuits sensitivity to process and thermal gradients. Also illustrated are base resistors $R_5$, $R_6$, $R_7$, $R_8$ which are chosen to be 626 ohms. Bias resistors $R_9$, $R_{10}$, $R_{11}$, $R_{12}$, $R_{13}$, $R_{14}$, $R_{15}$, $R_{16}$, $R_{17}$, $R_{18}$ are chosen to have a resistance of 12,000 ohms.

The subtractor circuit 14' generates two output voltages $OUT_0$, $OUT_{180}$, which represent complimentary output voltages. The output voltage $OUT_{180}$ is therefore 180° out-of-phase with the output voltage $OUT_0$. Both output voltages $OUT_0$, $OUT_{180}$ have equal dc output levels, which are independent of the exact transistor parameters or resistor values chosen.

All of the emitters of the transistors are grounded. If the load resistors are chosen properly, all of the transistor collectors are biased near the base-emitter voltage ($V_{be}$), so the base-collector voltage ($V_{bc}$) is approximately equal to zero. The transistors are thus operating at the transition between the active and saturation regions. Distortion is minimized by keeping signal swings below a few hundred millivolts. Because the emitters of all transistors are grounded, there can only be a single transistor in any serial current path between the supply voltage ($V_a$) and ground. As shown, each such serial current path includes at most two voltage drop components: one resistor and one transistor.

The subtractor circuit 14' of FIG. 16 can be a single stage or module of a subtractor 14. For example, by cascading a number of subtractor circuits, the common-mode rejection ratio can be enhanced. A cascade of two subtractor circuit stages is sufficient to make a well-improved subtractor. In a preferred embodiment of the invention, the subtractor circuits 14' are fabricated on-chip with the DACs 11,12.

Equivalents

While this invention has been particularly shown and described with reference to preferred embodiments thereof, it will be understood by those skilled in the art that various changes in form and details may be made therein without departing from the spirit and scope of the invention as defined by the appended claims.

The invention claimed is:

1. A circuit for converting a digital signal to an analog signal, comprising:

a positive supply line at a positive supply voltage from a power source;

a negative supply line at a negative supply voltage from the power source;

a first single-ended digital-to-analog converter interconnected to the positive and negative supply lines for producing a first analog signal in response to a digital signal from a digital input, the first analog signal including a first error component introduced by the first digital-to-analog converter;

a second single-ended digital-to-analog converter interconnected to the positive and negative supply lines for producing a second analog signal in response to the digital signal, the second analog signal being 180° out-of-phase relative to the first analog signal of the first digital-to-analog converter and including a second error component introduced by the second digital-to-analog converter, the second error component being in-phase with the first error component; and in the digital-to-analog converters, at most one transistor interconnected in any serial current path between the positive supply line and the negative supply line.

2. The circuit of claim 1 wherein the first and second error components are synchronized in time and include glitch energy from the respective digital-to-analog converter.

3. The circuit of claim 1 further comprising a subtractor coupled to the first digital-to-analog converter and the second digital-to-analog converter for producing an analog output signal, the analog output signal being the difference between the first analog signal and the second analog signal, the analog output signal having an even-order output error component at least about 20 dB less in magnitude than both the first error component and the second error component.

4. The circuit of claim 3 wherein the analog output signal has half-wave symmetry independent of frequency.

5. The circuit of claim 3 wherein the subtractor includes at least one differential amplifier.

6. The circuit of claim 5 wherein the at least one differential amplifier includes a plurality of transistors, at most one transistor interconnected in any serial current path between a positive and a negative amplifier supply line.

7. The circuit of claim 6 wherein the transistors are bipolar transistors, each transistor having an emitter interconnected to the negative amplifier supply line.

8. The circuit of claim 3 wherein the subtractor includes a plurality of cascaded subtractor stages.

9. The circuit of claim 1 wherein the transistors have an Early voltage of less than about 20 volts.

10. The circuit of claim 1 wherein the transistors are bipolar transistors.

11. The circuit of claim 10 wherein each transistor has a grounded emitter.

12. The circuit of claim 11 wherein the grounded emitters are grounded through a common substrate.

13. The circuit of claim 10 wherein the transistors are common-emitter-down heterojunction bipolar transistors.

14. A waveform generator for generating an analog waveform from digital inputs, comprising:
   a positive supply line at a positive supply voltage from a power source;
   a negative supply line at a negative supply voltage from the power source;
   a clock input signal for establishing a waveform frequency;
   a digital signal generator for generating periodic digital signals in response to the clock input signal, each digital signal representing a magnitude for a corresponding analog signal;
   a first single-ended digital-to-analog converter interconnected to the positive and negative supply lines and coupled to the digital signal generator for producing a respective first analog signal in response to each digital signal;
   a second single-ended digital-to-analog converter interconnected to the positive and negative supply lines and coupled to the digital signal generator for producing a respective second analog signal in response to each digital signal, each second analog signal being 180° out-of-phase relative to the corresponding first analog signal; and
   in the digital-to-analog converters, at most one transistor interconnected in any serial current path between the positive supply line and the negative supply line.

15. The circuit of claim 14 wherein each transistor has a grounded emitter.

16. The circuit of claim 15 wherein the grounded emitters are grounded through a common substrate.

17. The circuit of claim 15 wherein the transistors have an Early voltage of less than about 20 volts.

18. The circuit of claim 14 wherein the first and second analog signals include a respective level of glitch energy from the respective digital-to-analog converter, both levels of glitch energy being synchronized in time and in-phase with each other.

19. The waveform generator of claim 14 further comprising a subtractor coupled to receive each first analog signal from the first digital-to-analog converter and each second analog signal from the second digital-to-analog converter for producing an analog waveform, at any time the analog waveform having a corresponding analog output signal, the analog output signal being the difference between the received first analog signal and the received second analog signal.

20. The circuit of claim 19 wherein the analog waveform has half-wave symmetry independent of frequency.

21. The circuit of claim 19 wherein the subtractor includes at least one differential amplifier.

22. The circuit of claim 21 wherein the at least one differential amplifier includes a plurality of transistors, at most one transistor interconnected in any serial current path between a positive and a negative amplifier supply line.

23. The circuit of claim 22 wherein the transistors are bipolar transistors, each transistor having an emitter interconnected to the negative amplifier supply line.

24. The circuit of claim 19 wherein the subtractor includes a plurality of cascaded subtractor stages.

25. The circuit of claim 14 wherein the transistors are bipolar transistors.

26. The circuit of claim 25 wherein the transistors are common-emitter-down heterojunction bipolar transistors.

27. A method of converting a digital signal to an analog signal, comprising the steps of:
   providing a positive supply voltage from a power source over a positive supply line;
   providing a negative supply voltage from the power source over a negative supply line;
   powering a first single-ended digital-to-analog converter from the positive and negative supply lines, the first digital-to-analog converter having at most one transistor interconnected in any serial current path between the positive and the negative supply lines;
   powering a second single-ended digital-to-analog converter from the positive and negative supply lines, the second digital-to-analog converter having at most one transistor interconnected in any serial current path between the positive and the negative supply lines;
   in the first digital-to-analog converter, producing a first analog signal in response to a digital signal from a digital input, the first analog signal including a first error component introduced by the first digital-to-analog converter; and
   in the second digital-to-analog converter, producing a second analog signal in response to the digital signal, the second analog signal being 180° out-of-phase relative to the first analog signal of the first digital-to-analog converter and including a second error component introduced by the second digital-to-analog converter, the second error component being in-phase with the first error component.

28. The method of claim 27 wherein the first digital-to-analog converter and the second digital-to-analog converter have a plurality of transistors, each transistor having an emitter interconnected to the negative supply line.

29. The method of claim 28 wherein the emitters are interconnected to a common substrate.

30. The method of claim 27 further comprising the step of time synchronizing the first and second error components, the first and second error components including glitch energy from the respective digital-to-analog converter.

31. The method of claim 27 further comprising the steps of:
   in a subtractor coupled to the first digital-to-analog converter and the second digital-to-analog converter,
   producing an analog output signal, the analog output signal being the difference between the first analog signal and the second analog signal, the analog output signal having an even-order output error component at least about 20 dB less in magnitude than both the first error component and the second error component.

32. The method of claim 31 wherein the step of producing an analog output signal comprises yielding a signal having half-wave symmetry independent of frequency.

33. The method of claim 31 wherein the subtractor includes at least one differential amplifier.

34. The method of claim 33 wherein the at least one differential amplifier includes a plurality of transistors, at most one transistor interconnected in any serial current path between a positive and a negative amplifier supply line.

35. The method of claim 34 wherein the transistors are bipolar transistors, each transistor having an emitter interconnected to the negative amplifier supply line.

36. The method of claim 31 further comprising the step of cascading a plurality of subtractor stages.

37. The method of claim 27 wherein the transistors have an Early voltage of less than about 20 volts.

38. The method of claim 27 wherein the transistors are bipolar transistors.

39. The method of claim 38 wherein the transistors are common-emitter-down heterojunction bipolar transistors.

40. A method of generating an analog waveform from digital inputs, comprising the steps of:
providing a clock input signal to establish a waveform frequency;
providing a digital signal generator to generate periodic digital signals in response to the clock input signal, each digital signal representing a magnitude for a corresponding analog signal;
providing a positive supply voltage from a power source over a positive supply line;
providing a negative supply voltage from the power source over a negative supply line;
powering a first single-ended digital-to-analog converter from the positive and negative supply lines, the first digital-to-analog converter having at most one transistor interconnected in any serial current path between the positive and negative supply lines;
powering a second single-ended digital-to-analog converter from the positive and negative supply lines, the second digital-to-analog converter having at most one transistor interconnected in any serial current path between the positive and negative supply lines;
in the first digital-to-analog converter coupled to the digital signal generator, producing a respective first analog signal in response to each digital signal; and
in the second digital-to-analog converter coupled to the digital signal generator, producing a respective second analog signal in response to each digital signal, each second analog signal being 180° out-of-phase relative to the corresponding first analog signal.

41. The method of claim 40 wherein the first digital-to-analog converter and the second digital-to-analog converter have a plurality of transistors, each transistor having an emitter interconnected to the negative supply line.

42. The method of claim 41 wherein the emitters are interconnected to a common substrate.

43. The method of claim 41 wherein the transistors have an Early voltage of less than about 20 volts.

44. The method of claim 40 wherein the first and second analog signals include a respective level of glitch energy from the respective digital-to-analog converter, the levels of glitch energy being time synchronized and in-phase with each other.

45. The method of claim 40 further comprising the step of:
in a subtractor coupled to receive each first analog signal from the first digital-to-analog converter and each second analog signal from the second digital-to-analog converter, producing an analog waveform, at any time the analog waveform having a corresponding analog output signal, the analog output signal being the difference between the received first analog signal and the received second analog signal.

46. The method of claim 45 wherein the step of producing an analog waveform comprises yielding a signal having half-wave symmetry independent of frequency.

47. The method of claim 45 wherein the subtractor includes at least one differential amplifier.

48. The method of claim 47 wherein the at least one differential amplifier includes a plurality of transistors, at most one transistor interconnected in any serial current path between a positive and a negative amplifier supply line.

49. The method of claim 48 wherein the transistors are bipolar transistors, each transistor having an emitter interconnected to the negative amplifier supply line.

50. The method of claim 45 further comprising the step of cascading a plurality of subtractor stages.

51. The method of claim 40 wherein the transistors are bipolar transistors.

52. The method of claim 51 wherein the transistors are common-emitter-down heterojunction bipolar transistors.

53. A circuit for converting a digital input signal to an analog output signal, comprising:
a GaAs substrate for providing the circuit with a common voltage ground;
a first single-ended digital-to-analog converter having a plurality of transistors formed on the substrate and coupled to the digital input to generate a first analog signal having a first level of glitch energy, each transistor of the first digital-to-analog converter having an emitter interconnected to the substrate;
an inverter having at least one transistor formed on the substrate and coupled to the digital input to generate a complimented digital signal, each transistor of the inverter having an emitter interconnected to the substrate;
a second single-ended digital-to-analog converter having a plurality of transistors formed on the substrate and coupled to the complimented digital signal to generate a second analog signal having a second level of glitch energy, the second analog signal being 180° out-of-phase with the first analog signal and the second level of glitch energy being in-phase with the first level of glitch energy, each transistor of the second digital-to-analog converter having an emitter interconnected to the substrate;
a synchronizer circuit coupled to the first and second digital-to-analog converters to time-align the first and second levels of glitch energy; and
a subtractor coupled to the first and second digital-to-analog converters to generate an analog output signal equal to the first analog signal minus the second analog signal.

54. The circuit of claim 53 wherein the substractor comprises at least one differential amplifier formed on the substrate.

55. A subtractor circuit for processing differential input signals to form an output signal, comprising:
a voltage source providing a positive and a negative supply voltage; and
at most two voltage drop components electrically disposed in any serial current path between the positive and the negative supply voltages, each input signal being processed by a respective signal path, the signal paths being substantially identical to each other.

56. The subtractor circuit of claim 55 wherein the voltage drop components include at least one transistor.

57. The subtractor circuit of claim 56 wherein the at least one transistor is a bipolar transistor.

58. The subtractor circuit of claim 57 wherein the at least one transistor includes an emitter interconnected to the negative supply voltage.

59. The subtractor circuit of claim 56 wherein each transistor is operated at its transition between active and saturation.

60. The subtractor circuit of claim 55 wherein the voltage drop components are fabricated in a common-centroid fashion.

61. The subtractor circuit of claim 55 further comprising differential outputs.

62. The substrate circuit of claim 61 wherein the outputs have substantially equal output levels.

63. A circuit for converting a digital signal to an analog signal, comprising:

at least one digital to analog converter generating differential analog signals; and a balanced subtractor circuit for combining the differential analog signals into at least one output signal, the subtractor having at most two voltage drop components electrically disposed in any serial current path between a positive and a negative supply voltage, and each analog signal being processed by a respective circuit path, the circuit paths being substantially identical to each other.

64. The subtractor circuit of claim 63 wherein the voltage drop components include at least one transistor.

65. The subtractor circuit of claim 64 wherein the at least one transistor is a bipolar transistor.

66. The subtractor circuit of claim 65 wherein the at least one transistor includes an emitter interconnected to the negative supply voltage.

67. The subtractor circuit of claim 64 wherein each transistor is operated at its transition between active and saturation.

68. The subtractor circuit of claim 63 wherein the voltage drop components are fabricated in a common-centroid fashion.

69. The subtractor circuit of claim 63 further comprising differential outputs.

70. The substrate circuit of claim 69 wherein the outputs have substantially equal output levels.

* * * * *